US012610490B2

(12) United States Patent
    Bame

(10) Patent No.: US 12,610,490 B2
(45) Date of Patent: Apr. 21, 2026

(54) WEDGE BASED CIRCUIT BOARD RETAINER WITH DUAL END DRIVESCREW

(71) Applicant: WaveTherm Corporation, Raleigh, NC (US)

(72) Inventor: Rodney G Bame, Cary, NC (US)

(73) Assignee: WAVETHERM CORPORATION, Raleigh, NC (US)

( * ) Notice: Subject to any disclaimer, the term of this patent is extended or adjusted under 35 U.S.C. 154(b) by 156 days.

(21) Appl. No.: 18/439,147

(22) Filed: Feb. 12, 2024

(65) Prior Publication Data

US 2025/0261323 A1      Aug. 14, 2025

(51) Int. Cl.
    H05K 7/14          (2006.01)
(52) U.S. Cl.
    CPC ......... H05K 7/1404 (2013.01); H05K 7/1407 (2013.01); H05K 7/1427 (2013.01)
(58) Field of Classification Search
    CPC ... H05K 7/1404; H05K 7/1407; H05K 7/1427
    USPC ........................................ 361/801, 803, 759
    See application file for complete search history.

(56) References Cited

U.S. PATENT DOCUMENTS

| | | | |
|---|---|---|---|
| 3,820,592 A | * | 6/1974 | Lander ................ H01L 23/4006 |
| | | | 165/47 |
| 3,904,933 A | | 9/1975 | Davis |
| 4,480,287 A | | 10/1984 | Jensen |

| | | |
|---|---|---|
| 4,751,963 A | 6/1988 | Bui et al. |
| 4,819,713 A | 4/1989 | Weisman |
| 4,823,951 A | 4/1989 | Colomina |
| 4,879,634 A | 11/1989 | Storrow et al. |
| 5,010,444 A | 4/1991 | Storrow et al. |
| 5,057,968 A | 10/1991 | Morrison |
| 5,071,013 A | 12/1991 | Peterson |
| 5,156,647 A | 10/1992 | Ries |
| 5,414,592 A | 5/1995 | Stout et al. |
| 5,472,353 A | 12/1995 | Hristake et al. |
| 5,485,353 A | 1/1996 | Hayes et al. |

(Continued)

FOREIGN PATENT DOCUMENTS

| | | |
|---|---|---|
| CN | 210648925 U | 6/2020 |
| CN | 213511522 U | 6/2021 |

(Continued)

*Primary Examiner* — Hung S. Bui
(74) *Attorney, Agent, or Firm* — COATS & BENNETT, PLLC

(57)          ABSTRACT

A retainer for retaining an electronic module or printed circuit card in slots of a chassis, and related assemblies and methods. The retainer includes a mounting segment; a drive wedge disposed distally to the mounting segment; an anchor segment located distally relative to the drive wedge; and one or more intermediate wedges disposed in series between the drive wedge and the anchor segment along a longitudinal axis. The drive wedge, anchor segment, and one or more intermediate wedges are movably connected together in series. The retainer also includes a drive screw having a proximal portion with a first thread engaged with the mounting segment, and a distal portion with a second thread engaged with the drive wedge. The first and second threads are in opposing directions. The retainer is movable between a retracted configuration and a deployed configuration. The retainer has a greater height in the deployed configuration.

20 Claims, 8 Drawing Sheets

(56)  References Cited

U.S. PATENT DOCUMENTS

| | | | |
|---|---|---|---|
| 5,607,273 | A | 3/1997 | Kecmer et al. |
| 5,859,764 | A | 1/1999 | Davis et al. |
| 5,859,784 | A | 1/1999 | Sawahata |
| 5,887,435 | A | 3/1999 | Morton |
| 6,212,075 | B1 | 4/2001 | Habing et al. |
| 6,239,972 | B1 | 5/2001 | Tehan et al. |
| 6,246,582 | B1 | 6/2001 | Habing et al. |
| 6,678,159 | B1 | 1/2004 | Barcley |
| 6,687,130 | B2 | 2/2004 | Adams, Sr. et al. |
| 6,765,798 | B1 | 7/2004 | Ratliff et al. |
| 6,873,528 | B2 | 3/2005 | Hulan et al. |
| 7,031,167 | B1 | 4/2006 | Zagoory et al. |
| 7,349,221 | B2 | 3/2008 | Yurko |
| 7,483,271 | B2 | 1/2009 | Miller et al. |
| 8,045,332 | B2 | 10/2011 | Lee et al. |
| 8,456,846 | B2 | 6/2013 | Mosier et al. |
| 9,814,169 | B2 | 11/2017 | Mastrocola |
| 10,371,182 | B2 | 8/2019 | Milton |
| 2003/0223197 | A1 | 12/2003 | Hulan et al. |
| 2004/0070944 | A1 | 4/2004 | Wells et al. |
| 2011/0176867 | A1* | 7/2011 | Mosier ...................... F16B 2/14 403/409.1 |
| 2011/0261537 | A1 | 10/2011 | Sporer et al. |
| 2022/0233329 | A1* | 7/2022 | Marrocco ............. A61F 2/4455 |

FOREIGN PATENT DOCUMENTS

| | | | |
|---|---|---|---|
| CN | 220040514 | U | 11/2023 |
| EP | 1853097 | A2 | 11/2007 |
| GB | 2103020 | A | 2/1983 |
| GB | 2166004 | A | 4/1986 |

* cited by examiner

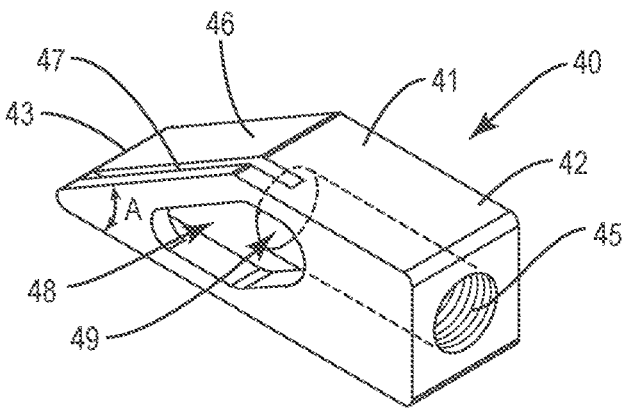
FIG. 5
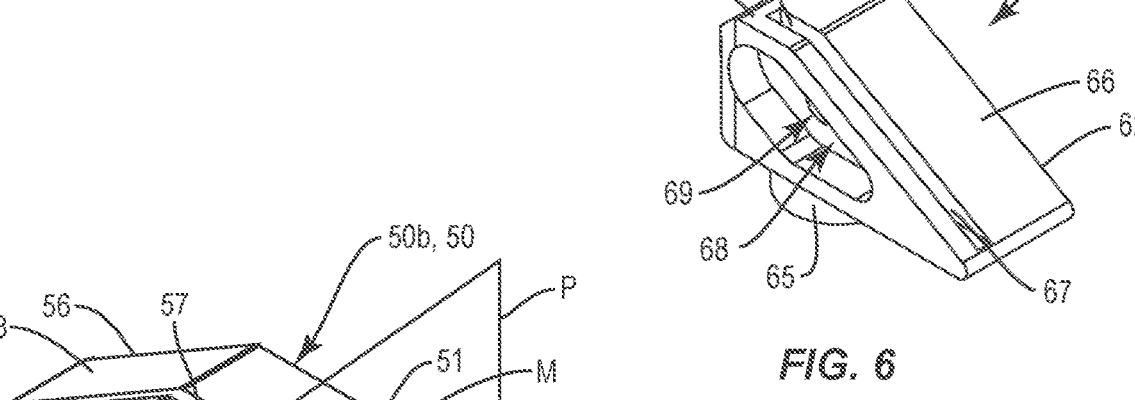
FIG. 7
FIG. 6
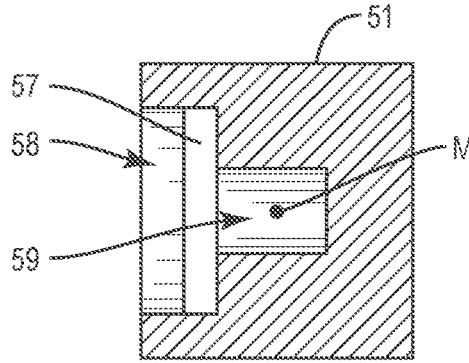
FIG. 8

WEDGE BASED CIRCUIT BOARD RETAINER WITH DUAL END DRIVESCREW

BACKGROUND

The present invention relates to clamping mechanisms for holding removable circuit boards and/or removable circuit board modules in place in electronics chassis, commonly known as circuit board retainers or card retainers or locking retainers.

Many harsh environment electronics systems, such as computer and telecommunications systems in aircraft and the like, are designed to use replaceable electronic circuit boards, sometimes referred to as Line Replaceable Units (LRUs). An LRU is a modular circuit board that is designed to plug into a chassis and electrically connect to other LRU boards via a backplane in the chassis. Typically, a given chassis is designed to hold multiple LRUs. In general, LRUs must comply with pre-determined specifications so that modules provided by various manufacturers may be readily used in combination. Example standards are, but are not limited to, VME, VME 64, VPX, cPCI, ATCA, AMC, ARINC, and MicroTCA, with these standards being defined by several organizations including ANSI, PICMG, IEEE, VITA, and other standards organizations. It is common for these standards to require that the LRUs be repeatably insertable into and removable from the chassis. Once the LRU is inserted, a card retainer is employed to secure the LRU to the chassis wall. In addition to providing a clamping mechanism to retain the module, a card retainer in a conduction cooled application can also provide an efficient method of transmitting thermal energy from the module (from the associated electronics in the LRU) to the walls of the chassis.

Typically, card retainers use a series of wedges that are forced to slide onto one another to clamp the LRU to the chassis. The action of adjacent wedges sliding against each other create an expansion of effective height of the total assembly which creates a frictional force that holds the LRU in place and creates the conductive path. In the prior art, the card retainer typically employs a central support member consisting of a long bar, a screw, or a shaft that connects and aligns all the wedges. The supporting member or shaft that connects all of the wedges to one another is typically positioned through the center of all of the wedges. For example, see U.S. Pat. Nos. 4,819,713 and 5,485,353. A linear force is applied to the aligned wedge segments to force the wedges towards one another by sliding along the central supporting member or shaft, converting horizontal force to vertical force.

An alternative arrangement of a card retainer which does not rely on central support member is shown in U.S. Pat. No. 8,456,846. The card retainer of the '846 patent has proven effective both in securing LRU's and in providing a good conductive heat path, but may be difficult and/or costly to assemble in some situations, and/or be cumbersome to deploy.

Thus, while the above arrangements have proven satisfactory for many situations, they may be less than satisfactory for others. As such, there remains a need for alternative designs for locking retainers.

SUMMARY

The present invention provides a retainer for retaining an electronic module or printed circuit card in slots of a chassis, and related assemblies and methods.

In one embodiment, the retainer comprises a mounting segment; a drive wedge disposed distally to the mounting segment; an anchor segment located distally relative to the drive wedge; and one or more intermediate wedges disposed in series between the drive wedge and the anchor segment along a longitudinal axis. The drive wedge, anchor segment, and one or more intermediate wedges are movably connected together in series. The retainer also includes a drive screw having a proximal portion with a first thread engaged with the mounting segment, and a distal portion with a second thread engaged with the drive wedge. The first and second threads are in opposing directions. The retainer is movable between a retracted configuration and a deployed configuration. In the retracted configuration: the retainer has first height normal to the longitudinal axis; the mounting segment and the anchor segment are separated by a first distance; the drive wedge and anchor segment are separated by a second distance. In the deployed configuration: the retainer has second height normal to the longitudinal axis; the second height greater than the first height; the mounting segment and the anchor segment are separated by the first distance; the drive wedge and anchor segment are separated by a third distance; the third distance less than the second distance. The proximal tip of the drive screw is optionally recessed within the mounting segment when the retainer is in a deployed configuration, and/or the first and second threads optionally have different pitches and/or thread diameters.

In another embodiment, the retainer comprises a mounting segment; a drive wedge disposed distally to the mounting segment; an anchor segment located distally relative to the drive wedge; and one or more intermediate wedges disposed in series between the drive wedge and the anchor segment along a longitudinal axis. The drive wedge, anchor segment, and one or more intermediate wedges are movably connected together in series. The retainer also includes a drive screw having a proximal portion with a first thread engaged with the mounting segment, and a distal portion with a second thread engaged with the drive wedge. The first and second threads are in opposing directions. The retainer is movable between a retracted configuration and a deployed configuration; the retainer has a greater height in the deployed configuration. The drive wedge, mounting segment, and drive screw are configured such that, in moving the retainer from the retracted configuration to the deployed configuration, the drive screw moves distally relative to the mounting segment and simultaneously proximally relative to the drive wedge. The proximal tip of the drive screw is optionally recessed within the mounting segment when the retainer is in a deployed configuration, and/or the first and second threads optionally have different pitches and/or thread diameters.

Various other aspects and embodiments are also disclosed, which may be employed alone or in any combination.

BRIEF DESCRIPTION OF THE DRAWINGS

FIG. 5 shows a side view of a drive wedge of the retainer of FIG. 2.

FIG. 6 shows a side view of an anchor segment of the retainer of FIG. 2.

FIG. 7 shows a side view of an intermediate wedge of the retainer of FIG. 2.

FIG. 8 shows a cross section of the retainer of FIG. 2 at a midpoint of a wedge segment along plane P normal to the longitudinal axis.

DESCRIPTION

The present disclosure is generally directed to a card retainer for mechanically securing a LRU in a chassis slot and providing a thermal transmission path, and related assemblies and methods. The card retainer includes a plurality of wedges that are movably interconnected and that move longitudinally relative to each other to change the height of the retainer. A drive screw mechanism is used to cause the wedges to move longitudinally relative to each other. The drive screw has opposing end portions that are oppositely threaded, which allows the retainer to be quickly changed between a retracted configuration and a deployed or locking configuration, while providing reliable mechanical clamping force and efficient thermal transmission.

Figure 1:
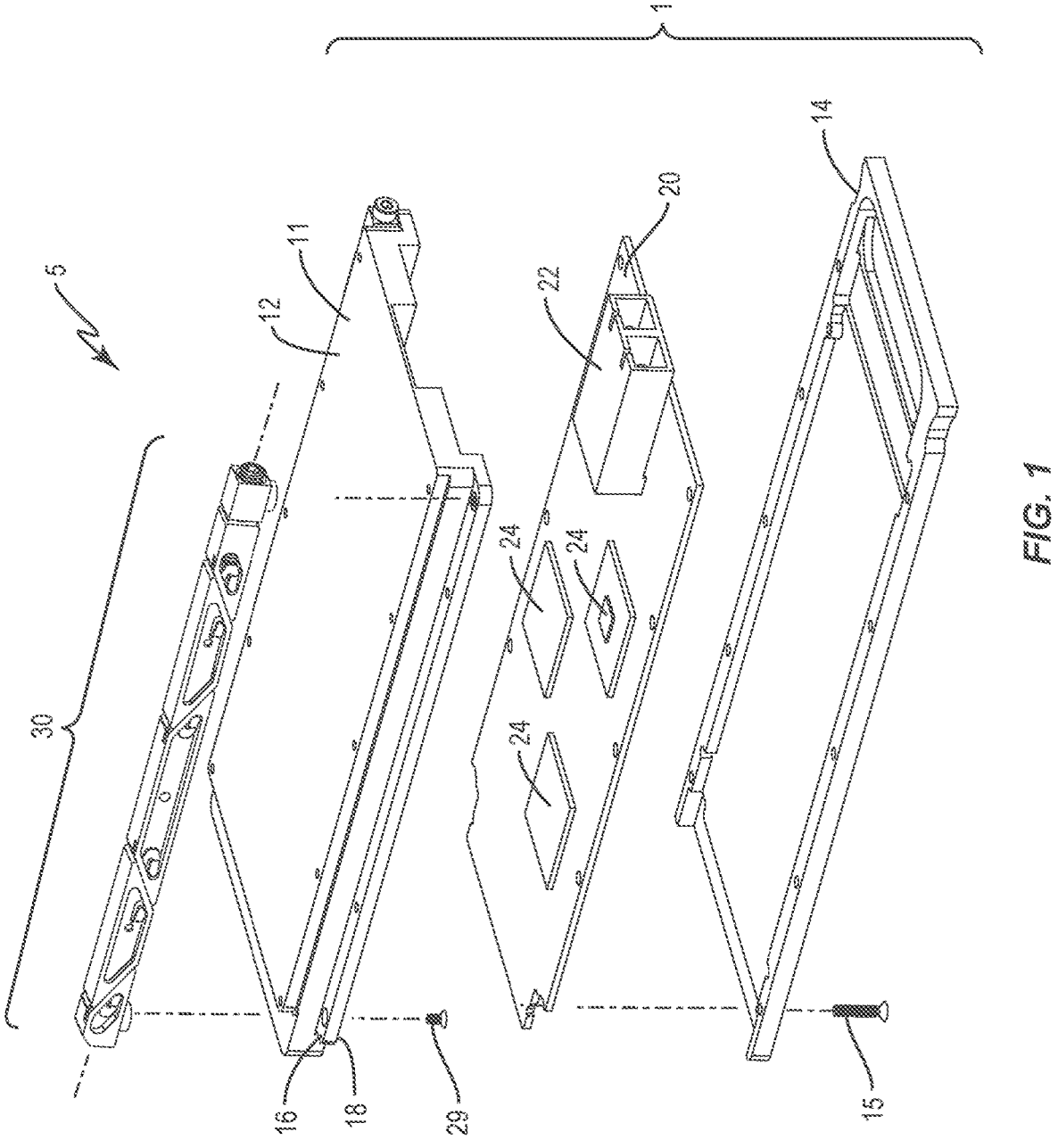
FIG. 1 shows an exploded LRU module assembly.

In one embodiment illustrated in FIG. 1, an exemplary LRU module assembly 5 includes an LRU module 10 and one or more card retainers (or "locking retainer", or simply "retainer") 30. The LRU module 10 includes a frame or housing 11 and at least one circuit board 20 secured to the housing 11. The housing 11 includes an upper housing 12 secured to a lower housing 14 via housing screws 15. The upper housing 12 includes a card retainer contact surface 16 for engaging the card retainer 30 and a module contact surface 18 for engaging the chassis to which the LRU module 10 is mounted. The housing screws 15 may, if desired, pass through suitable holes in circuit board 20, or the edge of the circuit board 20 may simply be clamped between the upper housing 12 and the lower housing 14. The upper housing 12 and lower housing 14 are designed to enable the circuit board 20 to withstand high shock and vibration environments by stabilizing and reinforcing the circuit board 1/O connectors 22 and other circuit board components 24. In addition to supporting the circuit board 20, the housing 11 also provides a path for removing thermal energy from the circuit board components 24. The card retainer 30 is mounted to the housing 11 via suitable retainer mounting screws 29, as discussed further below.

Figure 2:
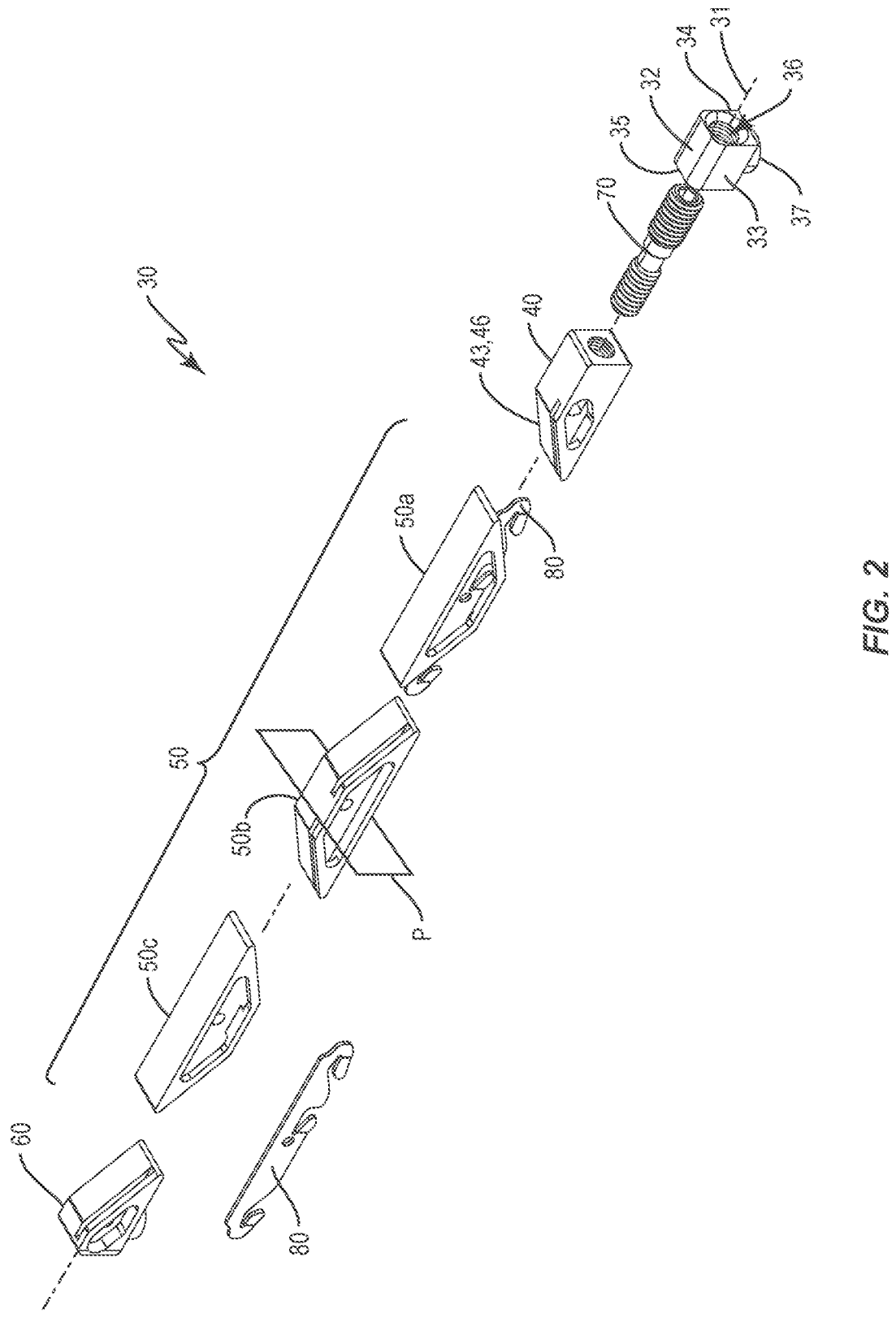
FIG. 2 shows an exploded view of a card retainer according to one embodiment of the invention.

One embodiment of the card retainer 30 is shown in FIG. 2. In general terms, the card retainer 30 of FIG. 2 includes a plurality of segments arranged in series along a centerline or longitudinal axis 31. In series, from the proximal end of the retainer 30 to the distal end of the retainer 30, the retainer 30 includes a mounting segment 32, a drive wedge 40, one or more intermediate wedges 50, and an anchor segment 60. The retainer 30 also includes a drive screw 70 and one or more links 80. The retainer 30 is movable between a retracted configuration (FIG. 3) and one or more deployed configurations (e.g., FIG. 4). The retainer 30 has a greater height in the deployed configuration than in the retraced configuration.

The mounting segment 32 includes a body 33 having a proximal face 34 and a distal face 35. When the proximal tip of the drive screw 70 is recessed into the mounting segment 32, as discussed below, the proximal face 34 forms the most proximal feature of the retainer 30. The lower side of the body 33 is configured to receive a retainer mounting screw 29, such as having an internally threaded mounting boss 37, for securing the mounting segment 32 to the housing 11 in a fixed location. The body 33 also includes a through hole 36 that is advantageously oriented parallel to, and optionally coincident with, the longitudinal axis 31. The hole 36 is internally threaded and configured to movably receive the proximal portion 72 of drive screw 70.

As shown in FIG. 5, the drive wedge 40 includes a body 41 having a proximal end 42 and a distal end 43. The body 41 advantageously has generally flat upper and lower faces that are disposed parallel to the longitudinal axis 31. The distal end 43 includes a ramp 46 which is angled at a ramp angle A, which may advantageously be approximately 30°-45°. The body 41 also incudes a slot 47 which extends from the ramp 46 inward into the body 41 to recess 48. Recess 48 is configured to movably receive an end portion 82 of link 80, as discussed further below. The proximal end 42 of body 41 also includes a hole 45 that is threaded and open towards the mounting segment 32. The hole 45 is internally threaded and configured to movably receive the distal portion 73 of drive screw 70. The body 41 may optionally include a cross-hole 49, which optionally extends part way through the body to hole 45, to aid in manufacturing the drive wedge 40.

As shown in FIG. 6, The anchor segment 60 includes a body 61 having a proximal end 62 and a distal end 63. The proximal end 62 includes a ramp 66 which is angled, advantageously at ramp angle A, but optionally at another angle. The body 61 also incudes a slot 67 which extends from the ramp 66 inward into the body 61 to recess 68. Recess 68 is configured to movably receive an end portion 82 of link 80, as discussed further below. The body 61 may optionally include a cross-hole 69, which optionally extends part way through the body 61, to aid in manufacturing the anchor segment 60. The lower side of the body 61 is configured to receive a retainer mounting screw 29, such as having an internally threaded mounting boss 63, for securing the anchor segment 60 to the housing 11 in a fixed location.

As indicated above, the retainer 30 includes one or more intermediate wedge(s) 50 disposed between the drive wedge 40 and the anchor segment 60. In the embodiment shown in FIG. 2, the retainer includes three intermediate wedges— first intermediate wedge 50a, second intermediate wedge 50b, and third intermediate wedge 50c. The intermediate wedges 50a,50b,50c are advantageously identical, but this is not required. The intermediate wedges 50a,50b,50c may be referred to as intermediate wedge 50 for simplicity. As shown in FIG. 7, intermediate wedge 50 includes a body 51 with a proximal end 52 and a distal end 53. The body 51 has a cross-sectional center M at its midpoint, which advantageously is aligned with the longitudinal axis 31 of the retainer 30 when the retainer 30 is in the retracted configuration. A theoretical plane P is disposed at center M and oriented normal to the longitudinal axis 31. See FIGS. 7-8. The proximal end 52 includes an angled ramp 56, and a slot 57 extending from the ramp 56 to a corresponding recess 58. Likewise, the distal end 53 includes an angled ramp 56, and a slot 57 extending from the ramp 56 to corresponding recess 58. Note that the recesses 58 of proximal end 52 and the distal end 53 are advantageously the same recess 58, but may be different recesses 58, as is desired. Recess 58 is configured to movably receive an end portion 82 of link 80, as discussed further below. The body 51 may optionally include a cross-hole 59, which optionally extends part way through the body 51, to aid in manufacturing the anchor segment 60.

Figure 9:
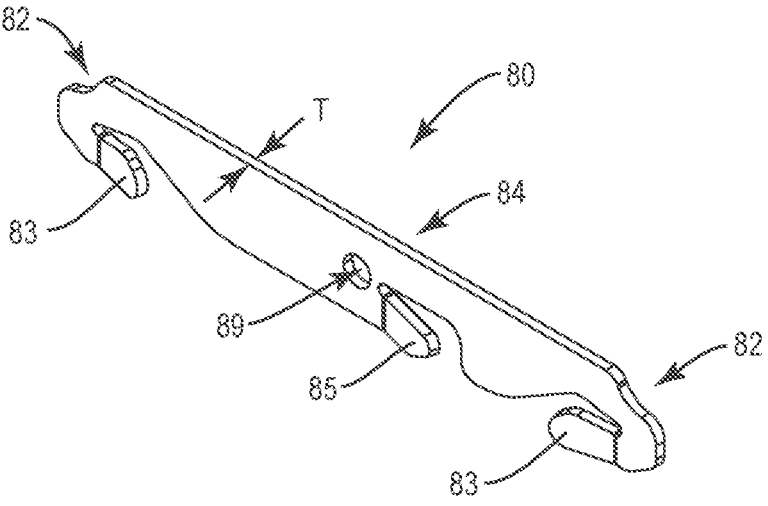
FIG. 9 shows a perspective view of a link of the retainer of FIG. 2.

Link(s) 80 help movably interconnect the drive wedge 40 to an adjacent intermediate wedge 50, intermediate wedge 50 to adjacent intermediate wedge 50, and intermediate wedge 50 to adjacent anchor segment 60. An exemplary link 80 is shown in FIG. 9. Link 80 includes a central section 84 with end portion 82 on each end thereof. The link 80 is generally planar with a thickness T which allows the link 80 to be received in slots 47,57,67. The link 80 advantageously includes a deflectable spring finger 83 in each end portion 82, and a deflectable spring finger 85 in the central section 84. The deflectable fingers 83,85 interact with the boundary walls of recesses 48,58,68 to releasably retain the wedge members (drive wedge 40, intermediate wedge 50, anchor segment 60) connected together. It is intended that the end portions 82 will move longitudinally and vertically within the corresponding slots 47,57,67 as the retainer 30 is moved from the retracted configuration to the deployed configuration, and vice versa. Finger 85 helps maintain the link 80 in recess 58 of the intermediate wedge 50 that the central section 84 is associated with, while allowing the link 80 to be removed if required for servicing of retainer 30. If desired, the link 80 may optionally include a cross-hole 89, which optionally extends entirely through link 80, to aid in manufacturing the link 80. Note that other approaches to movably interconnecting the wedges 40,50 and/or anchor segment 60, instead of or in addition to links 80, may be employed, such as any of the approaches (alone or in any combination) disclosed in U.S. Pat. No. 8,456,846, the disclosure of which is incorporated herein in its entirety.

Figures 3, 4:
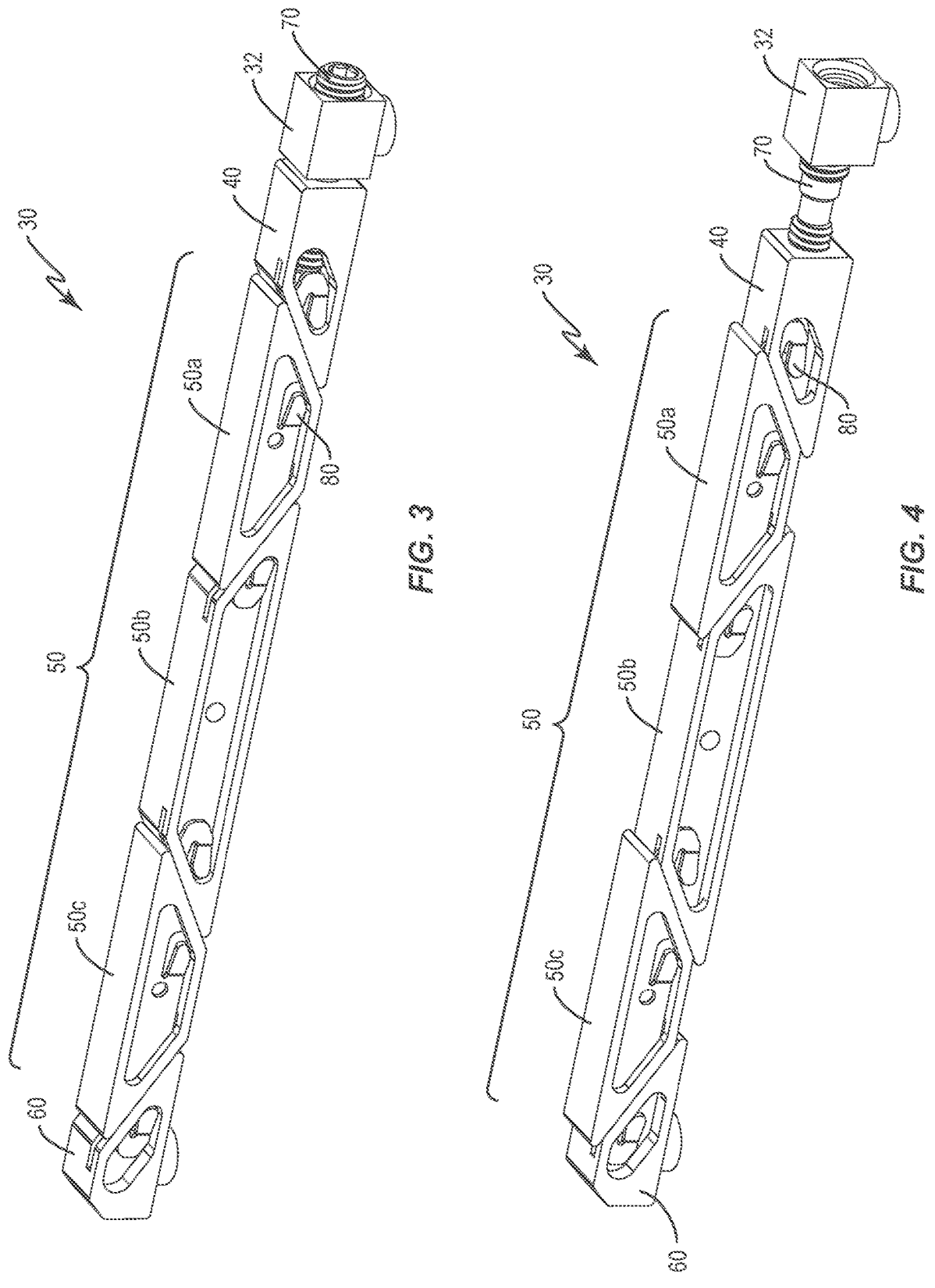
FIG. 3 shows a perspective view of the retainer of FIG. 2 in a retracted configuration.
FIG. 4 shows a perspective view of the retainer of FIG. 2 in a deployed configuration.
Figure 12:
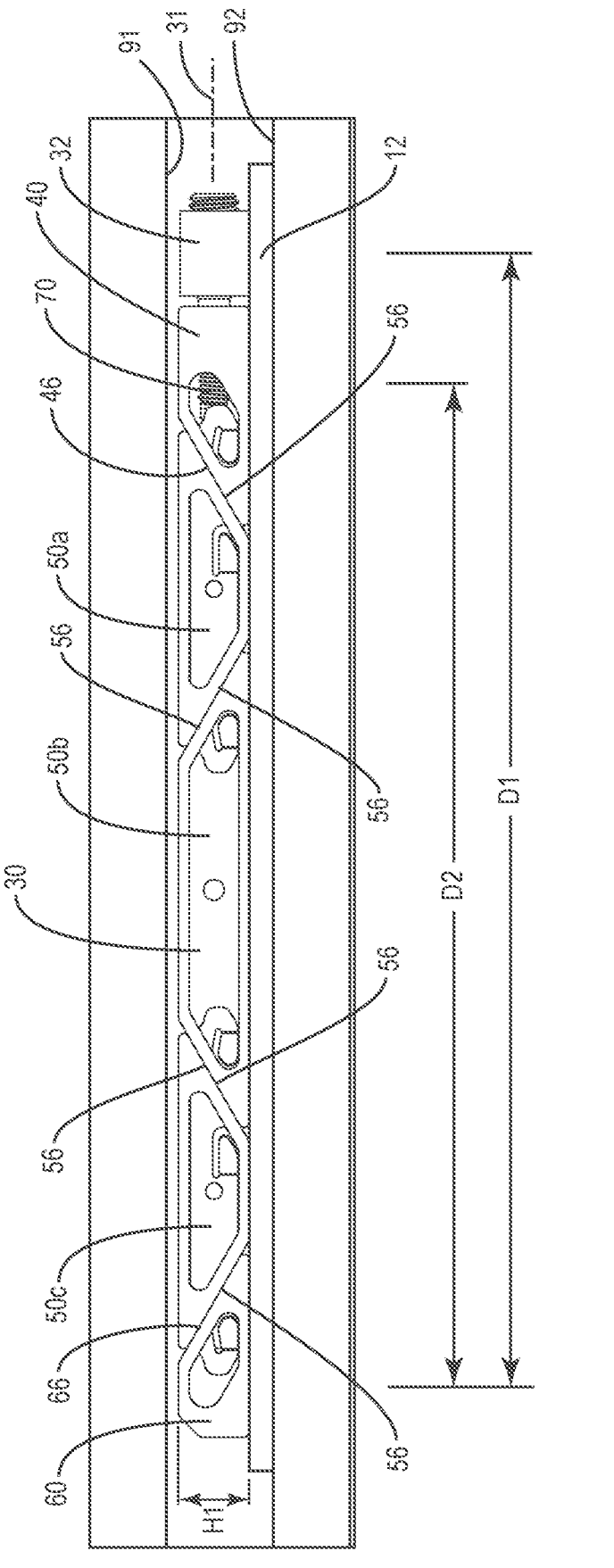
FIG. 12 shows a side view of the LRU module assembly in a chassis slot with the retainer of FIG. 2 in a retracted configuration.
Figure 13:
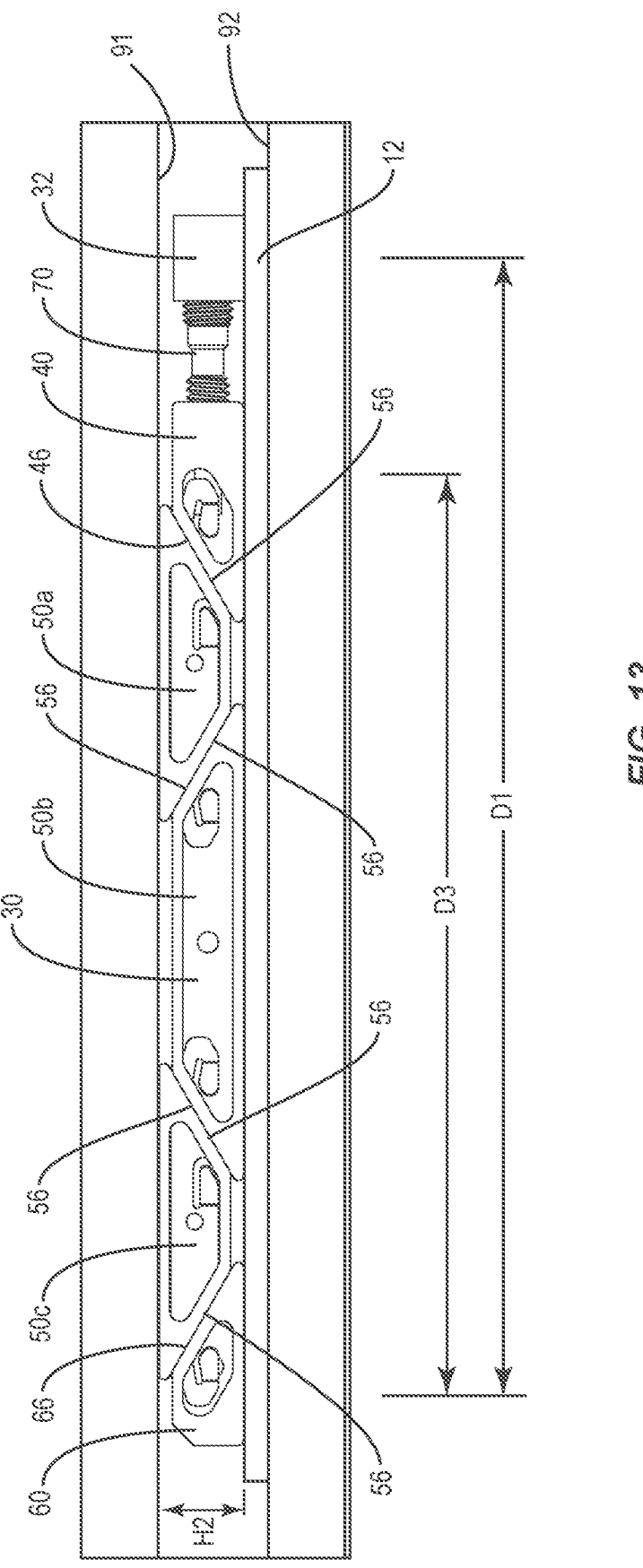
FIG. 13 shows a side view of the LRU module assembly in a chassis slot with the retainer of FIG. 2 in a deployed/locked/expanded configuration.

As indicated above, the retainer 30 is movable between a retracted configuration (FIG. 3 and FIG. 12) and one or more deployed (sometimes called "locked" or "expanded") configurations (e.g., FIG. 4 and FIG. 13). In the retracted configuration, the drive wedge 40, intermediate wedge(s) 50, and anchor segment 60 form a series of wedges that, in some embodiments, are vertically aligned so that their lower surfaces advantageously all rest on the retainer contact surface 16 of the module housing 11 that the retainer 30 is attached to. When moved to a deployed configuration, at least one of intermediate wedges 50 is displaced upward to press against the chassis to help lock the module 10 in place. To change the retainer 30 from the retracted configuration to the deployed configuration, the drive wedge 40 is displaced distally, longitudinally away from the mounting segment 32 and toward the anchor segment 60. Due to the presence of the ramps 46,56,66, the intermediate wedge(s) 50 are displaced longitudinally toward the anchor segment 60, and at least one intermediate wedge 50 is displaced vertically. The links 80 ride in their respective slots 47,57,67 to allow this relative movement between adjacent wedges to occur during this displacement.

Note that mounting segment 32 and anchor segment 60 are static components of the card retainer 30 and not moved during expansion/contraction of the retainer 30. For example, the retainer 30 is secured to the card retainer contact surface 16 using mounting screws 29 at the mounting segment 32 and anchor segment 60 to mount mounting segment 32 and anchor segment in place relative to the module housing 11. Alternatively, the retainer 30 may be secured in a similar fashion directly to the circuit board 20.

In general, the deployment of the card retainer 30 may be seen in FIGS. 3-4, 12-13. FIG. 3 and FIG. 12 show the card retainer 30 in the relaxed or retracted state. When the card retainer 30 is in the relaxed state, the module assembly 5 may slide in and out of the chassis with its alignment loosely provided by the chassis. In the retracted state, the distance (center to center) between mounting segment 32 and anchor segment 60 is D1, and the distance from drive wedge 40 to anchor segment 60 is D2, and the height of the retainer 30 is H1. The expanded state is shown in FIG. 4 and FIG. 13, where the upper surfaces of intermediate wedges 50a, 50c are in intimate contact with (press against) an upper surface 91 of chassis slot. Similarly, the module contact surface 18 is in intimate contact with lower surface 92 of chassis slot. When deployed, the distance between mounting segment 32 and anchor segment 60 remains at D1, but the distance from drive wedge 40 to anchor segment 60 shortens from D2 to D3, and the height of the card retainer increases to H2. In some embodiments, H2 may be 20%-40% more than H1.

When being moved from the deployed configuration back to the retracted configuration, the links 80, and particularly the interaction of the fingers 83 and the boundary walls of recesses 48,58,68, help "pull" the intermediate wedge(s) 50 back toward their positions in the retracted configuration, so that the intermediate wedge(s) 50 are no longer pressing on the upper surface 91, thereby allowing the module assembly 5 be "unlocked" from the chassis for removal.

Figure 10:
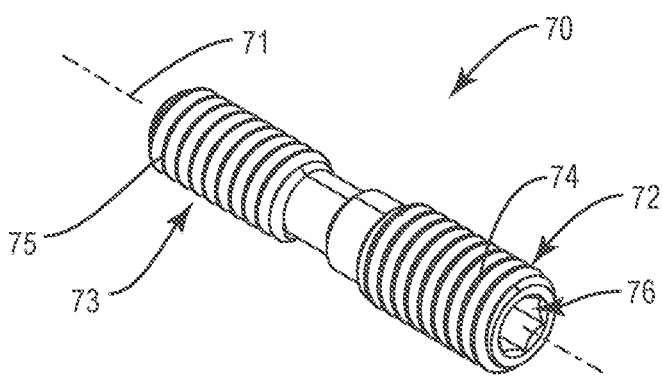
FIG. 10 shows a perspective view of a drive screw of the retainer of FIG. 2.
Figure 11:
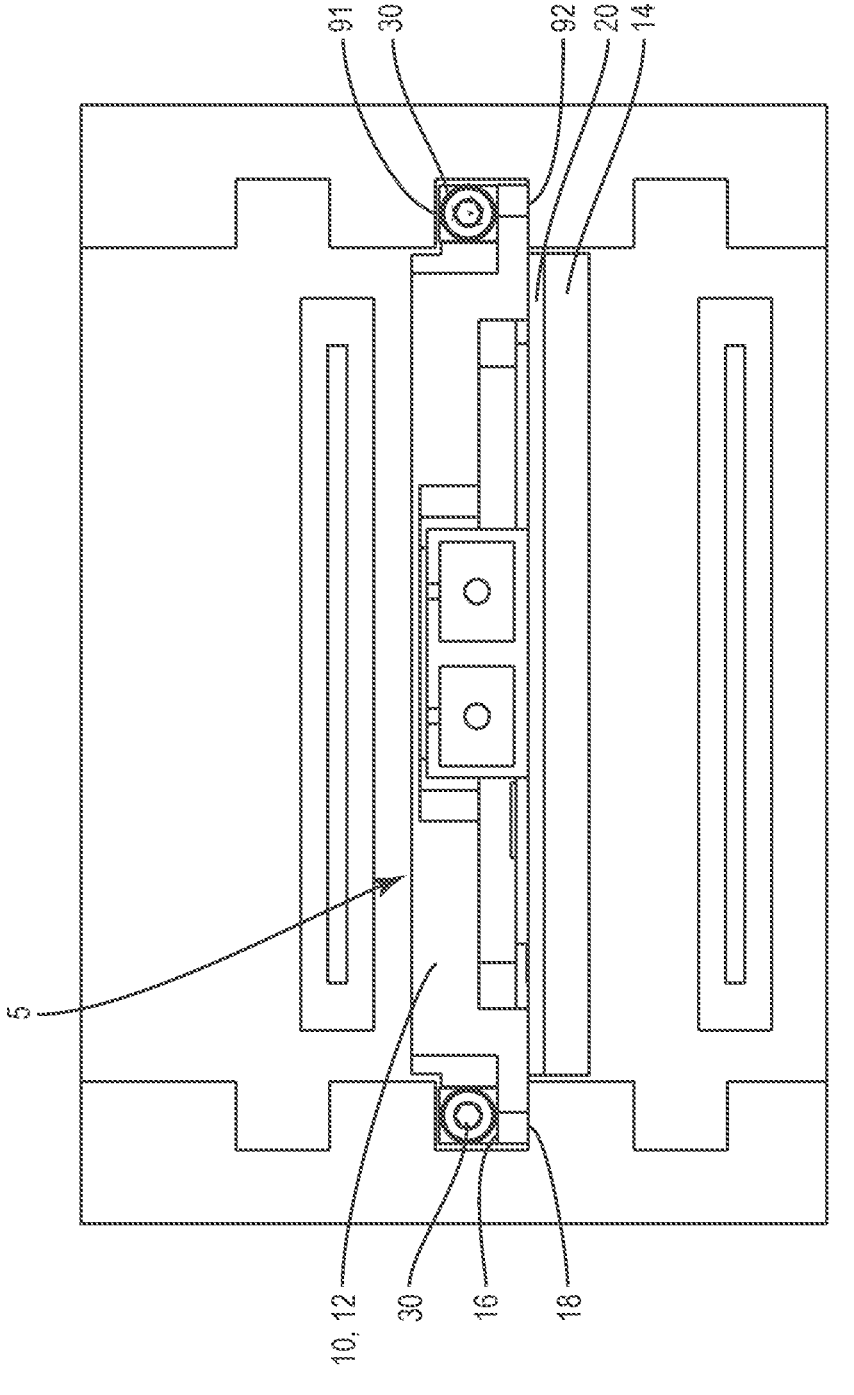
FIG. 11 shows the front view of an LRU mounted in a representative chassis.

The drive screw 70 is used to drive/displace the drive wedge 40 distally toward the anchor segment 60 and/or proximally toward the mounting segment 32. As shown in FIG. 10, the drive screw 70 extends along longitudinal axis 71, which is advantageously oriented parallel to, and optionally coincident with, the longitudinal axis 31. The drive screw 70 includes a proximal portion 72 and a distal portion 73. The proximal portion 72 has external first threads 74, and the distal portion 73 has external second threads 75. The first threads 74 and second threads 75 have opposite sense. For example, the first threads 74 are right-handed and the second threads 75 are left-handed, or vice versa. In some embodiments, the first threads 74 and the second threads 75 have the same pitch and thread diameter; in other embodiments, the first threads 74 and the second threads 75 have slightly different pitches and/or thread diameters which is believed to aid in resisting loosening during vibration. The proximal portion 72 also includes a feature for engaging with a drive tool, for example a faceted recess 76 such that the first threads 74 longitudinally overlap the tool-engaging recess 76 (e.g., a hexagonal cross-section recess 76 for mating with an Allen wrench). In some embodiments, such as that shown in FIG. 10, the proximal portion 72 of drive screw 70 is not larger in cross-section about axis 71 than the first threads 74, and thus does not have a formed screw head that extends outward away from axis 71 more than the first threads 74. This arrangement allows the proximal tip of proximal portion 72 to be recessed within the mounting segment 32 when the retainer 30 is in one of more of the deployed configurations. For example, for the deployed configuration shown in FIG. 4, the entire drive screw 70 is closer to the anchor segment 60 than the proximal face 34 of mounting segment 32, and the proximal tip of drive screw 70 is recessed within hole 36 of mounting segment.

When the drive screw 70 is turned to move the retainer 30 from the retracted configuration to the deployed configuration, the external first threads 74 inter-engage with the internal threads in hole 36 of mounting segment 32, and the external second threads 75 inter-engage with the internal threads in hole 45 of drive wedge 40 to push the drive wedge 40 distally away from mounting segment 32. Note that the amount of displacement of the drive wedge 40, for a given amount of rotation of drive screw 70, is twice as much as would be achieved if drive screw 70 had threads of only one sense. Thus, the drive screw 70 having threads of two different senses allows the retainer 30 to be deployed more quickly. Also, in at least the deployed configuration, the distal tip of the drive screw 70 does not extend into the most proximal intermediate wedge 50 (intermediate wedge 50a as illustrated), and advantageously does not extend distally beyond the drive wedge 40. As can be appreciated, the drive wedge 40, mounting segment 32, and drive screw 70 are configured such that, in moving the retainer 30 from the retracted configuration to the deployed configuration, the drive screw 70 moves distally relative to the mounting segment 32 and simultaneously proximally relative to the drive wedge 40. This advantageously results in the proximal tip of proximal section 72 of drive screw 70 being recessed into hole 36 of mounting segment 32. Also, in some embodiments, the second threads 75 go from being hidden by the drive wedge 40 in the retracted configuration, to being partially exposed from the drive wedge 40 in the deployed configuration. The drive screw 70 may advantageously be shorter than the longest of: the drive wedge 40 and a longest of the one or more intermediate wedges 50. The drive screw 70 and retainer 30 are advantageously configured such that none of the intermediate wedges 50 longitudinally overlap the drive screw 70 in the deployed configuration.

When the drive screw 70 is turned to move the retainer 30 from the deployed configuration to the retracted configuration, the external first threads 74 inter-engage with the internal threads in hole 36 of mounting segment 32, and external second threads 75 inter-engage with the internal threads in hole 45 of drive wedge 40 to pull the drive wedge 40 proximally toward from mounting segment 32. Note that the amount of displacement of the drive wedge 40, for a given amount of rotation of drive screw 70, is twice as much as would be achieved if drive screw 70 had threads of only one sense. Thus, the drive screw 70 having threads of two different senses allows the retainer 30 to be retracted more quickly. Further, in the retracted configuration, the distal tip of the drive screw 70 is advantageously located proximally relative to the distal face of the drive wedge 40, so that the distal tip does not protrude beyond the drive wedge 40.

Note that hole 36 in mounting segment 30 and hole 45 in drive wedge 40 are internally threaded appropriately to receive the first threads 74 and second threads 75, respectively. Further, these internal threads in these holes 36,45 are advantageously of a self-locking against vibration type, for example the self-locking thread design of the SPIRALOCK brand (Sprialock Corp. of Michigan).

The retainer 30 advantageously does not have a longitudinal member that extends through or along more than three intermediate wedges 50, and particularly not end to end. Stated another way, some embodiments are configured such that no intermediate wedge 50 has a longitudinal member extending therethrough that extends through more than two others of the set of moving wedges formed by drive wedge 40 and intermediate wedges 50. This allows, in some embodiments, the retainer 30 to change from a smaller vertical height retracted configuration to a larger vertical height deployed configuration by moving at least three wedge members 40,50, with those moving wedge members not longitudinally displaced along a common internal longitudinal element (e.g., central rod, shaft).

The retainer 30 is advantageously anchored to the housing 11 surrounding the circuit board 20 (or the board itself) at a mounting segment 32 disposed proximate one end of the retainer 30 and at an anchor segment 60 located farthest from the mounting segment 32, and not in between. Thus, in some embodiments, the retainer 30 is affixed in place at two separated points, with a plurality movable wedges 40,50 disposed between the points that longitudinally move toward each other to change the retainer 30 from a retracted (collapsed) configuration to a deployed (expanded) configuration. In some embodiments, one or more of the movable wedges 40,50 are designed such that no other portions of retainer 30 that that wedge is longitudinally movable relative to extends through a theoretical plane P that is disposed at a midpoint M of that wedge and oriented normal to the longitudinal axis 31. For example, as shown in FIG. 2, middle intermediate wedge 50b has a midpoint M. As shown in FIG. 8, for intermediate wedge 50b, theoretical plane P that is normal to axis 31 and contains point M does not have any other portions of the retainer 30 that are longitudinally movable relative to intermediate wedge 50b (when retainer is mounted) extending therethrough.

The discussion above has used a retainer 30 with three intermediate wedges 50, but any suitable number of intermediate wedges 50 may be used, such as one, four, five, seven, etc. Also, the discussion above has been in the context of the anchor segment 60 having an integrally formed ramp 66 that engages with a ramp 56 of the adjacent intermediate wedge 50. While this is believed advantageous, in some embodiments the most distal intermediate wedge 50 may omit a distal ramp 56 and the anchor segment 60 may omit the ramp 66 so that the most distal intermediate wedge 50 is pressed longitudinally against the anchor segment 60 without vertical displacement, in the deployed configuration. Further, while it is believed that all the various ramps 46,56,66 having the same ramp angle A is advantageous, the various ramp angles can alternatively be different or a mix of same and different, as is desired.

In some embodiments, the drive wedge 40, the one or more intermediate wedges 50, and the anchor segment 60 are members of a group of segments; and a plurality of links 80 movably interconnect adjacent ones of the members of the group; wherein each of those plurality of links 80 engages three of the members of the group of segments. Such an arrangement is shown in FIG. 2, where one link 80 (shown with intermediate wedge 50a) engages drive wedge 40, intermediate wedge 50a, and intermediate wedge 50b; and another link 80 (shown exploded) engages intermediate wedge 50b, intermediate wedge 50c, and anchor segment 60.

The discussion above have generally been in the context of the retainer 30 being oriented so that the anchoring points at the mounting segment 32 and the anchor segment 60 are "down" relative to the "up" expansion direction. However, it should be understood that inverted installations are also within the scope of the present invention.

In general, the retainer 30 may be made from any suitable material, such as metals and metal alloys. Advantageously, the mounting segment 32, drive wedge 40, intermediate wedges 50, and anchor segment 60 are made from aluminum or aluminum alloys, while the drive screw 70, links 80, and screws 29,15, and the like are from stainless steel.

In various embodiments, the present invention has one or more of the above attributes, alone or in any combination.

The present invention may, of course, be carried out in other ways than those specifically set forth herein without departing from essential characteristics of the invention. The present embodiments are to be considered in all respects as illustrative and not restrictive, and all changes coming within the meaning and equivalency range of the appended claims are intended to be embraced therein.

What is claimed is:

1. A locking retainer, comprising:
a mounting segment;
a drive wedge disposed distally to the mounting segment;
an anchor segment located distally relative to the drive wedge;
one or more intermediate wedges disposed in series between the drive wedge and the anchor segment along a longitudinal axis;
wherein the drive wedge, anchor segment, and one or more intermediate wedges are movably connected together in series;
a drive screw having a proximal portion with a first thread engaged with the mounting segment, and a distal portion with a second thread engaged with the drive wedge; wherein the first and second threads are in opposing directions;
wherein the retainer is movable between a retracted configuration and a deployed configuration:
   wherein, in the retracted configuration:
      the retainer has first height normal to the longitudinal axis;
      the mounting segment and the anchor segment are separated by a first distance;
      the drive wedge and anchor segment are separated by a second distance;
   wherein, in the deployed configuration:
      the retainer has second height normal to the longitudinal axis; the second height greater than the first height;
      the mounting segment and the anchor segment are separated by the first distance;
      the drive wedge and anchor segment are separated by a third distance; the third distance less than the second distance.

2. The locking retainer of claim 1, wherein the drive screw does not extend distally beyond the drive wedge in the deployed configuration.

3. The locking retainer of claim 1, wherein the drive screw is axially recessed relative to a proximal face of the mounting segment in the deployed configuration.

4. The locking retainer of claim 1, wherein none of the one or more intermediate wedges longitudinally overlap the drive screw in the deployed configuration.

5. The locking retainer of claim 1, wherein the locking retainer is configured such that, to move from the retracted configuration to the deployed configuration, the drive wedge is moved away from the mounting segment; and wherein the first threads are right-handed.

6. The locking retainer of claim 1, wherein the first threads have a different pitch and/or thread diameter than the second threads.

7. The locking retainer of claim 1, wherein the one or more intermediate wedges comprise first, second, and third intermediate wedges disposed in series with the first intermediate wedge disposed closer to the drive wedge and the third intermediate wedge disposed closer to the anchor segment, and the second intermediate wedge disposed between the first and third intermediate wedges.

8. The locking retainer of claim 1, wherein the anchor segment comprises an integrally formed ramp disposed toward the one or more intermediate wedges.

9. The locking retainer of claim 1:
wherein the one or more intermediate wedges include a middle wedge;
wherein all portions of the locking retainer that the middle wedge is longitudinally movable relative to do not extend longitudinally through a theoretical plane disposed at a longitudinal midpoint of the middle wedge member and oriented normal to the longitudinal axis.

10. The locking retainer of claim 1, wherein the proximal portion of the drive screw has a faceted recess configured to engage with tool, the first threads longitudinally overlapping the recess.

11. A locking retainer, comprising:
a mounting segment;
a drive wedge disposed distally to the mounting segment;
an anchor segment located distally relative to the drive wedge;
one or more intermediate wedges disposed in series between the drive wedge and the anchor segment along a longitudinal axis;
wherein the drive wedge, anchor segment, and one or more intermediate wedges are movably connected together in series;
a drive screw having a proximal portion with a first thread engaged with the mounting segment, and a distal portion with a second thread engaged with the drive wedge; wherein the first and second threads are in opposing directions;
wherein the retainer is movable between a retracted configuration and a deployed configuration; wherein the retainer has a greater height in the deployed configuration;
wherein the drive wedge, mounting segment, and drive screw are configured such that, in moving the retainer from the retracted configuration to the deployed configuration, the drive screw moves distally relative to the mounting segment and simultaneously proximally relative to the drive wedge.

12. The locking retainer of claim 11, wherein, in the deployed configuration, the drive screw does not extend distally beyond the drive wedge, but the second thread does extend proximally beyond the drive wedge.

13. The locking retainer of claim 11, wherein the drive screw is axially recessed relative to a proximal face of the mounting segment in the deployed configuration.

14. The locking retainer of claim 11, wherein none of the one or more intermediate wedges longitudinally overlap the drive screw in the deployed configuration.

15. The locking retainer of claim 11, wherein the locking retainer is configured such that, to move from the retracted configuration to the deployed configuration, the drive wedge is moved away from the mounting segment and toward the anchor segment; and wherein the first threads are right-handed.

16. The locking retainer of claim 11, wherein the first threads have a different pitch and/or thread diameter than the second threads.

17. The locking retainer of claim 11, wherein the one or more intermediate wedges comprise first, second, and third intermediate wedges disposed in series with the first intermediate wedge disposed closer to the drive wedge and the third intermediate wedge disposed closer to the anchor segment, and the second intermediate wedge disposed between the first and third intermediate wedges.

18. The locking retainer of claim 11, wherein the anchor segment comprises an integrally formed ramp disposed toward the one or more intermediate wedges.

19. The locking retainer of claim 11:

wherein the one or more intermediate wedges include a middle wedge;

wherein all portions of the locking retainer that the middle wedge is longitudinally movable relative to do not longitudinally extend through a theoretical plane disposed at a longitudinal midpoint of the middle wedge member and oriented normal to the longitudinal axis.

20. The locking retainer of claim 11, wherein the proximal portion of the drive screw has a faceted recess configured to engage with tool, the first threads longitudinally overlapping the recess.

* * * * *